(12) United States Patent
Yang et al.

(10) Patent No.: US 8,105,736 B2
(45) Date of Patent: Jan. 31, 2012

(54) METHOD AND SYSTEM FOR OVERLAY CORRECTION DURING PHOTOLITHOGRAPHY

(75) Inventors: Xiao Yang, Cupertino, CA (US); Yuxiang Wang, Palo Alto, CA (US); Ye Wang, Cupertino, CA (US); Justin Payne, San Jose, CA (US); Wook Ji, San Jose, CA (US)

(73) Assignee: Miradia Inc., Santa Clara, CA (US)

( * ) Notice: Subject to any disclaimer, the term of this patent is extended or adjusted under 35 U.S.C. 154(b) by 615 days.

(21) Appl. No.: 12/047,780

(22) Filed: Mar. 13, 2008

(65) Prior Publication Data

US 2009/0233244 A1    Sep. 17, 2009

(51) Int. Cl.
   *G03F 9/00*    (2006.01)
(52) U.S. Cl. .......................................... 430/22; 430/30
(58) Field of Classification Search .................... 430/22, 430/30
   See application file for complete search history.

(56) References Cited

U.S. PATENT DOCUMENTS

| | | | |
|---|---|---|---|
| 4,334,156 A | 6/1982 | Bohlen et al. | |
| 5,783,340 A * | 7/1998 | Farino et al. | 430/22 |
| 5,783,342 A | 7/1998 | Yamashita et al. | |
| 5,877,861 A | 3/1999 | Ausschnitt et al. | |
| 6,006,351 A | 12/1999 | Peretz et al. | |
| 6,023,779 A | 2/2000 | Fullam et al. | |
| 6,440,612 B1 | 8/2002 | Baggenstoss | |
| 6,638,671 B2 | 10/2003 | Ausschnitt et al. | |
| 6,696,220 B2 | 2/2004 | Bailey et al. | |
| 6,779,171 B2 | 8/2004 | Baggenstoss | |
| 6,811,934 B2 | 11/2004 | Baggenstoss | |
| 6,819,426 B2 * | 11/2004 | Sezginer et al. | 356/401 |
| 6,826,743 B2 | 11/2004 | Park et al. | |
| 6,841,889 B2 | 1/2005 | Baggenstoss | |
| 6,842,229 B2 | 1/2005 | Sreenivasan et al. | |
| 6,870,599 B2 | 3/2005 | Kurosawa | |
| 6,893,786 B2 | 5/2005 | Baggenstoss | |
| 6,902,853 B2 | 6/2005 | Sreenivasan et al. | |
| 6,916,585 B2 | 7/2005 | Sreenivasan et al. | |
| 6,919,152 B2 | 7/2005 | Sreenivasan et al. | |
| 6,921,615 B2 | 7/2005 | Sreenivasan et al. | |
| 6,937,344 B2 | 8/2005 | Monshouwer et al. | |
| 6,954,275 B2 | 10/2005 | Choi et al. | |
| 6,986,975 B2 | 1/2006 | Sreenivasan et al. | |
| 7,060,324 B2 | 6/2006 | Bailey et al. | |
| 7,126,669 B2 | 10/2006 | Edart | |
| 7,172,921 B2 | 2/2007 | Yang et al. | |
| 7,186,483 B2 | 3/2007 | Sreenivasan et al. | |
| 7,229,273 B2 | 6/2007 | Bailey et al. | |
| 7,277,185 B2 | 10/2007 | Monshouwer et al. | |
| 7,303,383 B1 | 12/2007 | Sreenivasan et al. | |
| 7,317,509 B2 | 1/2008 | Edart | |
| 7,709,166 B2 * | 5/2010 | Ziger et al. | 430/30 |
| 7,911,612 B2 * | 3/2011 | Kiers et al. | 356/399 |
| 2007/0097487 A1 | 5/2007 | Yang et al. | |

* cited by examiner

*Primary Examiner* — Christopher Young
(74) *Attorney, Agent, or Firm* — Kilpatrick Townsend & Stockton LLP (57) ABSTRACT

A method of performing overlay error correction includes forming a photoresist layer over a substrate and exposing a first set of apertures to incident radiation. The method also includes determining an overlay error associated with the first set of apertures and determining an overlay correction as a function of the determined overlay error. The method further includes exposing a data area and a second set of apertures. The data area and the second set of apertures are exposed based, in part, on the determined overlay correction. Moreover, the method includes verifying the determined overlay correction.

16 Claims, 6 Drawing Sheets

METHOD AND SYSTEM FOR OVERLAY CORRECTION DURING PHOTOLITHOGRAPHY

BACKGROUND OF THE INVENTION

This present invention relates generally to manufacturing objects. More particularly, the invention relates to a method and system for measuring and correcting overlay error during photolithographic processing. Merely by way of example, the invention has been applied to the formation and exposure of multiple overlay measurement features. The method and system can be applied to photolithographic processing of CMOS structures as well as other devices, for example, micro-electromechanical systems (MEMS) including sensors, detectors, and displays.

During various semiconductor manufacturing processes, there is a need to control the alignment between various layers present in the semiconductor devices. For example, in the semiconductor manufacturing industry, it is common to fabricate electronic devices by forming and patterning a series of layers (e.g., semiconductors, insulators, metals, and the like) using photolithography processes. As a particular example, the fabrication of MEMS may include the use of photoresist as a sacrificial material supporting suspended structures during an initial stage of the fabrication process. At a later stage of the fabrication process, the sacrificial photoresist is removed to release the suspended structures (e.g., micromirrors, accelerometer elements, and the like) so that they are free to move as appropriate to the particular application. Generally, the relative position of the structures both within particular layers and with respect to structures in other layers is an important parameter that impacts the performance of completed electronic devices.

The relative position of structures within an electronic device is generally referred to as overlay and deviations from desired relative positions is generally referred to as overlay error. In some semiconductor processes for encapsulated oxygen-ashable sacrificial materials, overlay error is addressed through the use of conventional photoresist rework. In the photoresist rework process, a first coat of photoresist is applied to the semiconductor substrate and lithographic processing (pre-bake, exposure, post-exposure bake, develop, and the like) is performed to determine the overlay correction values. Flood exposure or a solvent wash is then used to strip the patterned photoresist. A low temperature oxygen plasma process or other cleaning process is then used to remove any residual surface organic residue. A second coat of photoresist is then applied and lithography is performed, taking the overlay error measured during the first portion of the photoresist rework process into account.

The photoresist rework described above presents problems for semiconductor processes including the use of sacrificial materials. For example, the presence of the sacrificial materials at various positions in the structure may limit subsequent temperature processes to particular temperatures and may limit the chemicals to which the structure can be exposed, even when the sacrificial material (e.g., photoresist) is fully encapsulated. Thus, when downstream processes involve overlay correction, which as discussed above, is common when device alignment is an important parameter, stripping of the photoresist can become a challenging and time consuming task. For example, the conventional stripping and rework process typically doubles the number of process steps used to correct for overlay error. Additionally, the conventional process can introduce particles, which adversely impact device yield by increasing the defect density. Thus, there is a need in the art for improved systems and methods for correcting overlay error in photolithographic processes.

SUMMARY OF THE INVENTION

According to the present invention, techniques for manufacturing objects are provided. More particularly, the invention relates to a method and system for measuring and correcting overlay error during photolithographic processing. Merely by way of example, the invention has been applied to the formation and exposure of multiple overlay measurement features. The method and system can be applied to photolithographic processing of CMOS structures as well as other devices, for example, micro-electromechanical systems (MEMS) including sensors, detectors, and displays.

According to an embodiment of the present invention, a method of performing overlay error correction is provided. The method includes forming a photoresist layer over a substrate and exposing a first set of apertures to incident radiation. The method also includes determining an overlay error associated with the first set of apertures and determining an overlay correction as a function of the determined overlay error. The method further includes exposing a data area and a second set of apertures based, in part, on the determined overlay correction and verifying the determined overlay correction.

According to an alternative embodiment of the present invention, a method of performing overlay error correction is provided. The method includes forming a photoresist layer over a substrate and exposing a set of apertures to incident radiation. The method also includes determining an overlay error associated with the set of apertures, determining an overlay correction as a function of the determined overlay error, and exposing a data area of the substrate, based, in part, on the determined overlay correction.

Many benefits are achieved by way of the present invention over conventional techniques. For example, the present technique reduces the number of process steps and the corresponding process cycle time for lithography processes (as much as 50%) and reduces the level of particles and potential defects associated with conventional photoresist rework processes, which in turn helps to increase production throughput. Additionally, embodiments of the present invention are applicable to general lithography steps in both CMOS and/or MEMS device fabrication flows in which a stringent overlay specification is utilized, but no established pre-correction values are available. Moreover, embodiments increase wafer yield and increase overlay error correction accuracy in comparison with conventional rework processes. For example, some embodiments of the present invention eliminate photoresist rework processes through the use of the described overlay error correction techniques. Furthermore, embodiments of the present invention help to eliminate potential damage to portions of semiconductor devices (e.g., mirror stacks) that are processed using a conventional photoresist rework process. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF SPECIFIC EMBODIMENTS

Figure 1:
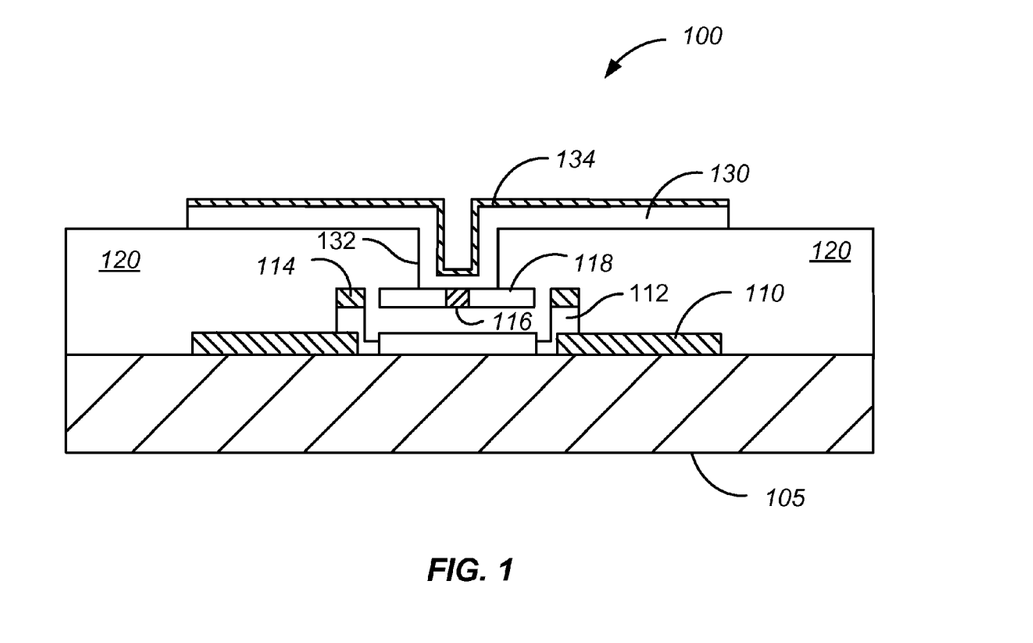
FIG. 1 is a simplified schematic diagram illustrating a semiconductor device at an intermediate stage of processing.

FIG. 1 is a simplified schematic diagram illustrating a semiconductor device at an intermediate stage of processing. As illustrated in FIG. 1, a micro-mirror 100 for display applications is illustrated at one portion of a process flow during the spatial light modulator (SLM) fabrication process. A CMOS wafer 105 is illustrated after a via formation process. Bottom electrode layer 110, which is formed using a low temperature PVD metal deposition process, is provided on the CMOS wafer 105. The bottom electrode layer is fabricated in an embodiment using deposition, photolithography, and etching processes. As an example, the bottom electrode layer 110 may include a multi-layer metal stack such as 1,000 Å of titanium nitride (TiN), 8,000 Å of aluminum, and another 1,000 Å of TiN.

Sacrificial photoresist material 120 is formed over the CMOS substrate and the bottom electrode layer. The sacrificial photoresist material 105 encapsulates an HDP insulator layer, 112 coupled to the bottom electrode layer. An upper electrode layer 114 is mechanically coupled to the HDP insulator layer and electrically coupled to the bottom electrode layer. In the structure illustrated in FIG. 1, the upper electrode layer 114 and torsion hinge 116 are fabricated from a single crystal silicon layer that is bonded to the HDP insulator layer using a substrate bonding process. Additional information related to the substrate bonding process is provided in U.S. patent application Ser. No. 11/028,946, filed on Jan. 3, 2005, and entitled "Method and Structure for Forming an Integrated Spatial Light Modulator," the disclosure of which is commonly assigned and hereby incorporated by reference in its entirety for all purposes. A cavity is formed below the torsion spring hinge 116 to allow for rotation of the hinge and single crystal landing structure 118 in response to electrical activation by the electrodes.

The material used for sacrificial layer 120 is sacrificial in the sense that it provides mechanical support for subsequently deposited and patterned layers and is then removed in other subsequent processing steps. In some embodiments, the material used to form sacrificial layer 120 is photoresist, although this is not required by the present invention. Planarization of the sacrificial layer is performed in some embodiments. Preferably, the planarized surface of layer 120 is characterized by a waviness, defined as a peak to valley roughness, of less than 50 nm. A planar mirror plate 130 with a mirror post in contact with the torsion spring hinge 116 and the landing structure 118 includes a reflective layer 134 coupled to the upper surface of the mirror plate 130. The mirror post and the mirror plate may be deposited using an amorphous silicon deposition process, for example, a physical vapor deposition (PVD) process. In a particular embodiment, the PVD process is performed at a temperature of less than 300° C., although in other embodiments, the formation temperature is lower, for example, less than 200° C. or less than 100° C. The reflective layer may be formed using a PVD process in which a Ti seed layer and an Al layer are deposited on the mirror plate 130.

In order to define the geometry of the mirror plate, a mirror patterning process is utilized that generally includes lithography and etching processes that selectively remove portions of the reflective Ti/Al layer 134 and portions of the amorphous silicon layer to form mirror plate 130. As discussed more fully below, the alignment of the edges of the mirror plate and the lower electrodes is determined during these lithography and etching processes. In display applications, the dimensions of the mirror plate are on the order of 15 µm×15 µm or 9.6 µm by 9.6 µm. Moreover, the definition of other features of the SLM structure utilize lithography processes with predetermined process tolerances. Thus, the fabrication of these SLM devices benefit from the overlay correction techniques described throughout the present specification.

After definition of the mirror plate, the sacrificial material 120 is removed, freeing the mirror plate to rotate about the torsion spring hinge. In some process flows in which the sacrificial material is photoresist, a plasma ashing process is used to remove the photoresist, exposing the mirror and freeing the mirror to rotate under the influence of the electrodes and bias voltages. Additional description of SLM structures and methods for fabricating such SLMs are provided in U.S. patent application Ser. No. 11/448,149, filed on Jun. 5, 2006, and entitled, "High Fill Ratio Silicon Spatial Light Modulator," the disclosure of which is commonly assigned and hereby incorporated by reference in its entirety for all purposes.

Figure 2:
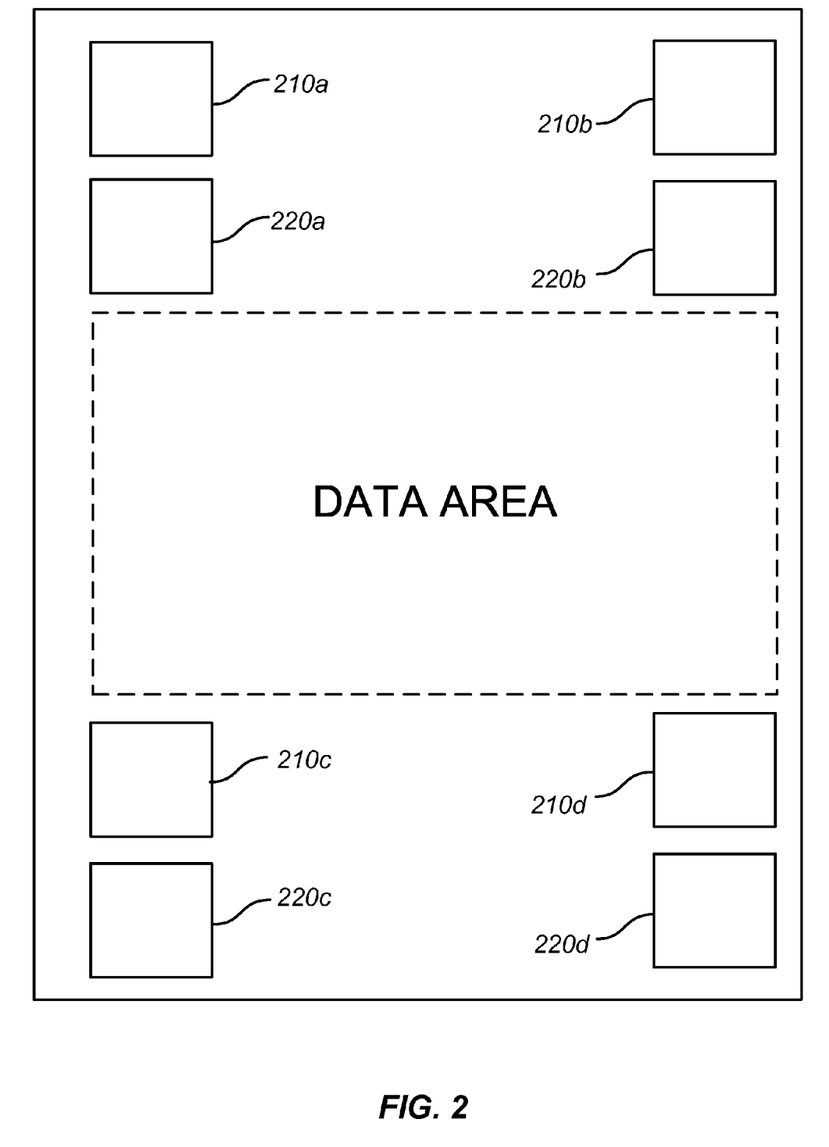
FIG. 2 is simplified schematic diagram of a substrate prior to overlay correction according to an embodiment of the present invention.

FIG. 2 is simplified schematic diagram of a substrate prior to overlay correction according to an embodiment of the present invention. Referring to FIG. 2, two sets of overlay correction outer boxes (210a, 201b, 210c, and 210d) and (220a, 220b, 220c, and 220d) are provided at predetermined positions on the substrate. The first and second sets of overlay correction boxes, 210 and 220, respectively, are provided during a previous processing step (not shown). The data area illustrated in the center of the substrate is provided for purposes of illustration and is associated with the region in which devices will be fabricated. As will be evident to one of skill in the art, the position of the first and second set of overlay boxes at the corners of the substrate is merely for purposes of illustration since these overlay correction boxes could be provided at other positions on the substrate. Additionally, although the overlay boxes may be interspersed in the data area, they are illustrated as separate from the data area for purposes of clarity.

Figure 3:
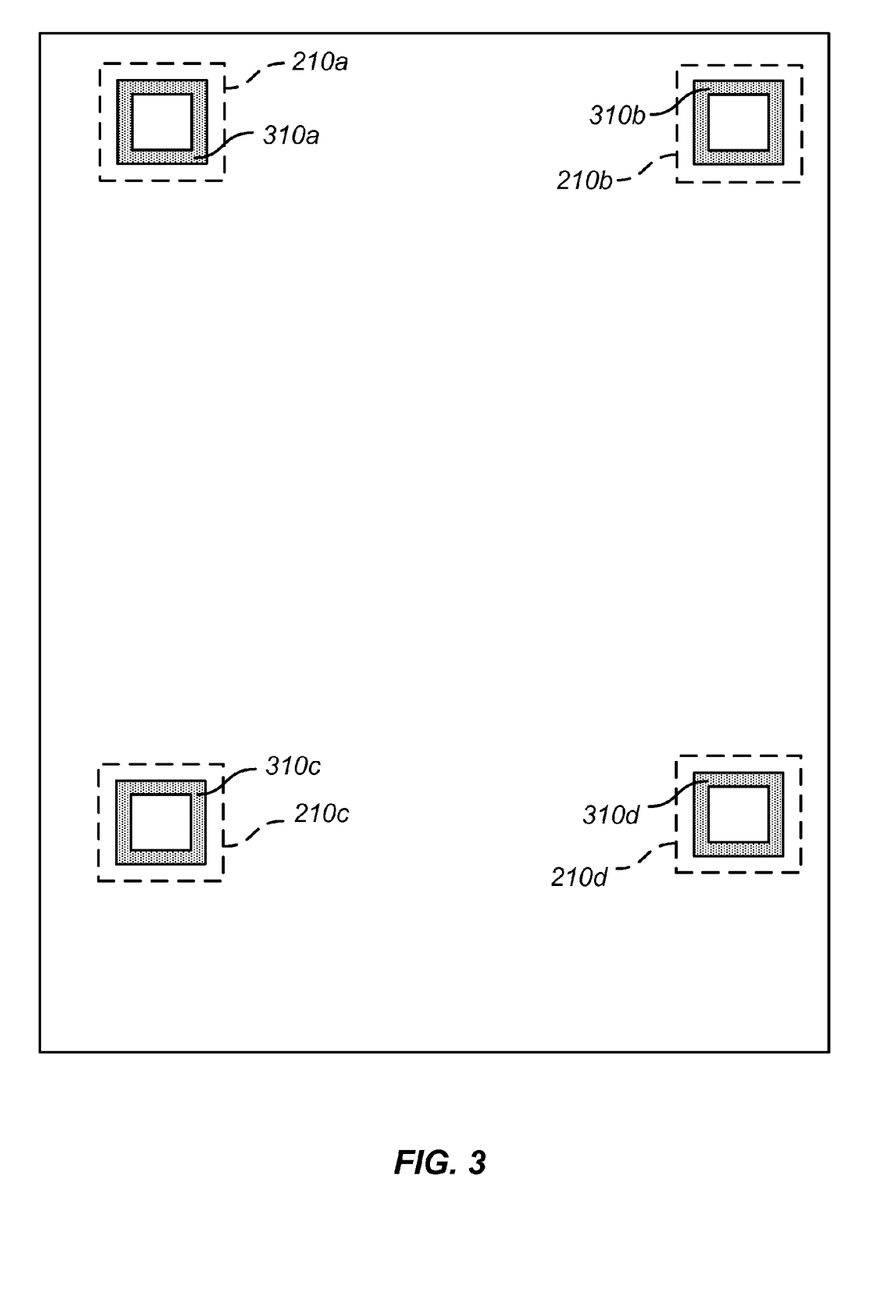
FIG. 3 is a simplified schematic diagram of a first mask utilized during lithography according to an embodiment of the present invention.

FIG. 3 is a simplified schematic diagram of a first mask utilized during lithography according to an embodiment of the present invention. In the first mask illustrated in FIG. 3, four overlay apertures (310a, 310b, 310c, and 310d) are associated with the first set of overlay correction boxes 210a, 210b, 210c, and 210d. The first mask provides for imaging of the four overlay apertures 310a-310d without imaging of either the areas associated with the second set of overlay correction boxes 220a-220d (not shown) or the data area (not shown). Thus, in an embodiment, the only portions of the substrate which are exposed using the first mask are the overlay apertures, which will be associated with the first set of overlay correction boxes.

By limiting the exposure of the substrate to regions associated with the first set of overlay correction boxes (e.g., the first set of overlay correction boxes), remaining portions of the photoresist are not exposed, preserving the photoresist in these remaining portions for future processing. Thus, in embodiments of the present invention, the entire mask is chrome except for the regions associated with the four overlay correction boxes 310a-310d. When the images exposed using the first mask are developed, the only patterns developed will be those associated with the four overlay apertures 310a-310d. The remaining photoresist on the substrate will not be developed to any significant extent since while the developer solution does dissolve unexposed photo resist to a small extent, the removal rate of unexposed photoresist is extremely slow or negligible.

In the embodiment illustrated in FIG. 3, a box within a box scheme is utilized as the overlay correction alignment marks. However, this particular geometry is not required by the present invention. In other embodiments, other geometries including interlaced L-shaped marks, other standard lithographic alignment marks, and the like are utilized. Moreover, open viewing areas surrounding each of the overlay correction boxes in the first set of overlay correction boxes are utilized in some embodiments in order to increase ease of use. Thus, although the term "overlay correction boxes" is utilized herein, embodiments of the present invention are not limited to overlay correction elements in a rectangular shape. Other suitable elements of various shapes and sizes are included within the scope of the present invention. One of ordinary skill in the art would recognize many variations, modifications, and alternatives.

After exposure and other processes associated with exposure using the first mask (e.g., pre-bake, post-bake, and the like), the registration of the four overlay apertures 310a-310d to the first set of overlay correction boxes 210a-210d is measured to determine one or more overlay correction values. The determined overlay correction value(s) are utilized in a subsequent lithography step as described more fully below.

Figure 4:
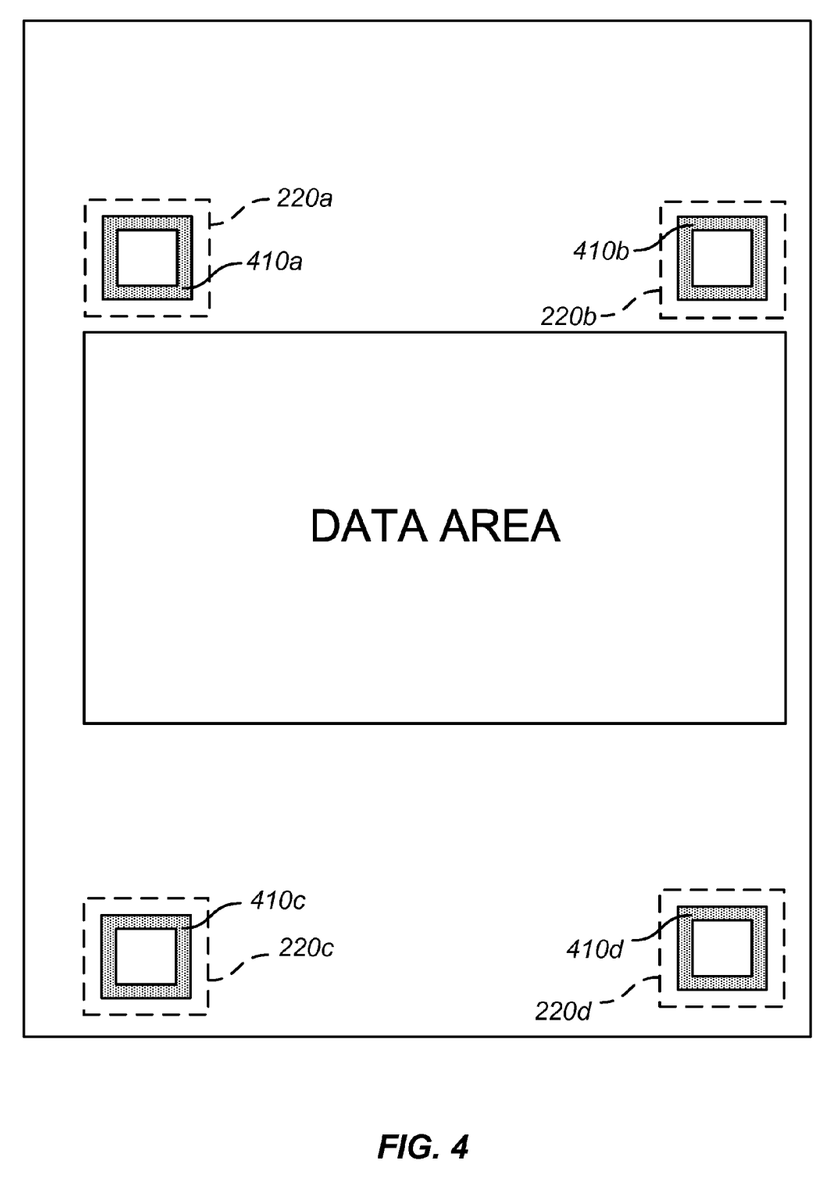
FIG. 4 is a simplified schematic diagram of a second mask utilized during lithography according to an embodiment of the present invention.

FIG. 4 is a simplified schematic diagram of a second mask utilized during lithography according to an embodiment of the present invention. The second mask includes a second set of four overlay apertures (410a, 410b, 410c, and 410d) that are associated with the second set of overlay correction boxes 220a, 220b, 220c, and 220d. The second mask is utilized in a second lithography process in which the four overlay apertures 410a-410d are exposed. As described more fully in relation to FIG. 6, overlay correction boxes 220a-220d are optional in embodiments in which the overlay correction error is not verified. In these embodiments, only the data area is provided on the second mask as described more fully below.

In addition to the exposure of portions of the substrate associated with the four overlay apertures 410a-410d, the data area is exposed, providing for lithographic exposure of device features associated with the particular process defined by the second mask. It will be noted that the substrate goes through the second exposure process using the second mask without stripping and recoating of the photoresist layer present prior to the first exposure process.

The second set of four overlay apertures 410a-410d are utilized to confirm that the process in which the overlay correction measured using the first set of overlay correction boxes 210a-210d and overlay apertures 310a-310d and then accounted for in performing the exposure using the second mask, was correct. Thus, in addition to the data area, the four overlay correction apertures 410a-410d are provided on the second mask for purposes of process verification associated with the overlay correction taken into account during the second lithographic exposure. One of ordinary skill in the art would recognize many variations, modifications, and alternatives.

The overlay error correction techniques described herein provide methods and systems to eliminate photoresist rework in some embodiments in which photolithography processes are performed on top of thin films deposited over sacrificial materials that are ashable in oxygen plasma environments.

Utilizing embodiments of the present invention, since the device area in which device elements are found (data area) is not patterned during the first exposure process, there is no need to strip the photoresist in preparation for the second lithography and exposure process. Thus, the substrate undergoes lithography and exposure to define the devices using the first photoresist coating. Therefore, in some embodiments, the need for rework is eliminated by using a single photoresist coating for both the overlay correction measurement process utilizing the first set of four overlay apertures (310a-310d) and a second mask containing the device features associated with the second mask level (data area) and a second set of overlay apertures (410a-410d). The lithography and exposure processes for the second mask are performed in light of the overlay error measured using the first set of four overlay apertures. Thus, the second set of overlay apertures is used to verify that the overlay error measured using the first set of overlay apertures is corrected for when using the second mask.

The methods and systems described herein are generic for all photolithography processes in which photoresist rework is currently utilized. In fact, as described above, some embodiments of the present invention provide for the complete elimination of photoresist rework processes for some mask layers.

Figure 5:
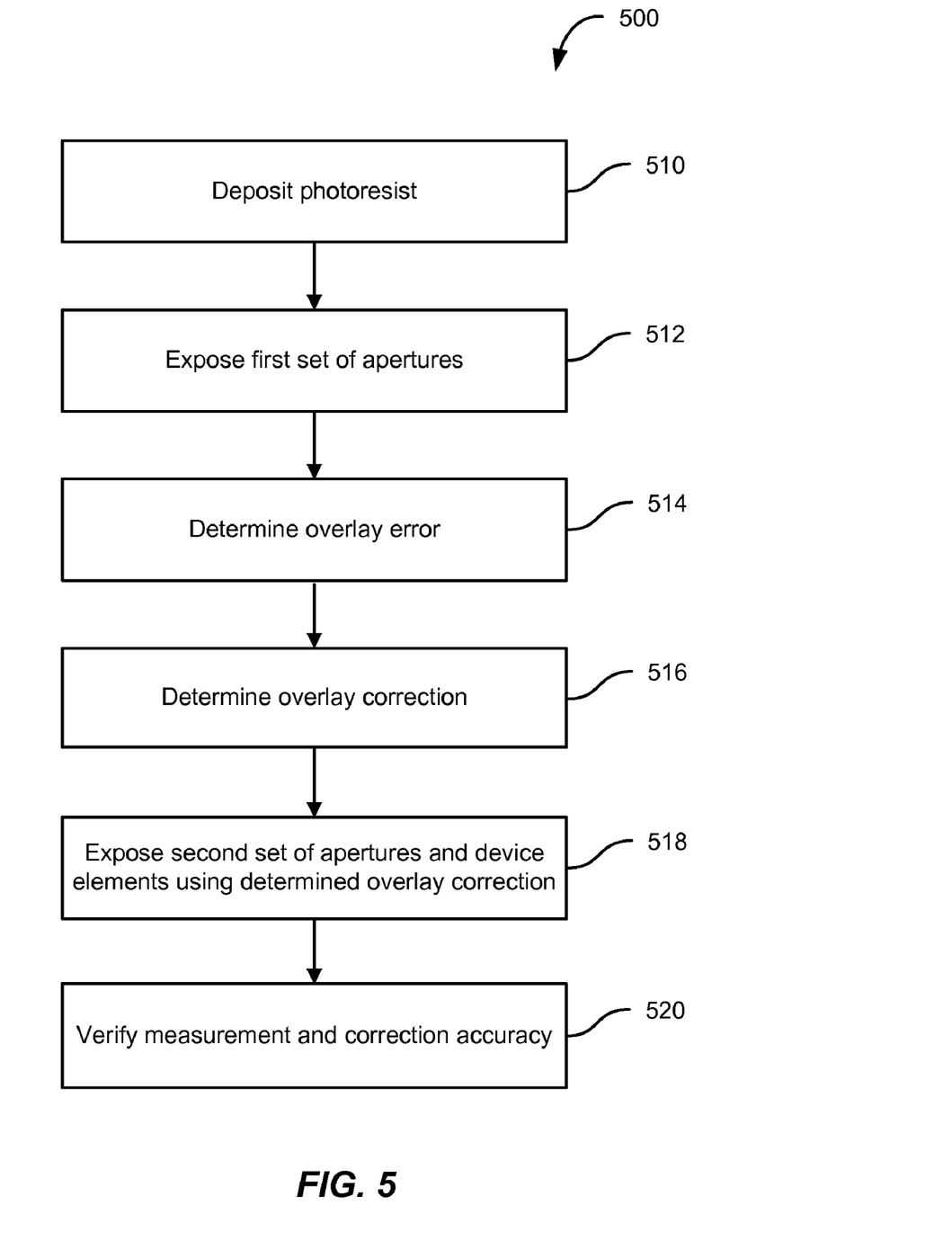
FIG. 5 is a simplified flowchart of a method of performing overlay error correction according to an embodiment of the present invention.

FIG. 5 is a simplified flowchart of a method of performing overlay error correction according to an embodiment of the present invention. The method 500 includes forming or depositing a layer of photoresist on a substrate (510). The properties of the photoresist layer, including thickness, are selected as appropriate to the particular process flow being performed on the substrate. In an embodiment, two sets of overlay correction boxes are provided in a previous process step. These two sets of overlay correction boxes are illustrated as features 210a-210d and 220a-220d in FIG. 2. It should be noted that in some embodiments in which the overlay error measurement and correction process is not verified, only a single set of overlay correction boxes (e.g., 210a-210d) are provided in the previous process step.

A first set of apertures are exposed (510) in relation to the overlay correction boxes 210a-210d. In the embodiment shown in FIG. 2, the first set of apertures are illustrated by boxes 310a-310d, but this is not required by the present invention. Other alignment mark shapes are provided in other embodiments. For instance, as one example, the shape of the overlay correction boxes may not be rectangular, but L-shaped, with one or more corresponding L-shaped apertures suitable for registration to the L-shaped overlay correction boxes. Thus the term overlay correction boxes is not limited to rectangular of "box" shaped features, which are merely utilized as exemplary features herein. One of ordinary skill in the art would recognize many variations, modifications, and alternatives.

The overlay error is determined (514) by measuring the registration of the first set of apertures to the overlay correction boxes 210a-210d. Various methods may be utilized to determine the overlay error including optical methods, diffraction-based methods such as scatterometry and the like. The overlay correction is determined (516) as a function of the overlay error. Utilizing the determined overlay correction, a second set of apertures and the device features are exposed (518). Since the overlay error measured using the first set of apertures was utilized in performing the second exposure, the device elements or features in the data area are exposed with reduced to minimal overlay error. Thus, embodiments of the present invention provide for increased device yields. Additionally, since the second exposure is performed using the photoresist layer previously deposited (510), no rework is needed in some embodiments of the present invention. Thus, embodiments of the present invention also provide for increased throughput and cost savings.

It should be appreciated that the specific steps illustrated in FIG. 5 provide a particular method of performing overlay error correction according to an embodiment of the present invention. Other sequences of steps may also be performed according to alternative embodiments. For example, alternative embodiments of the present invention may perform the steps outlined above in a different order. Moreover, the individual steps illustrated in FIG. 5 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 6:
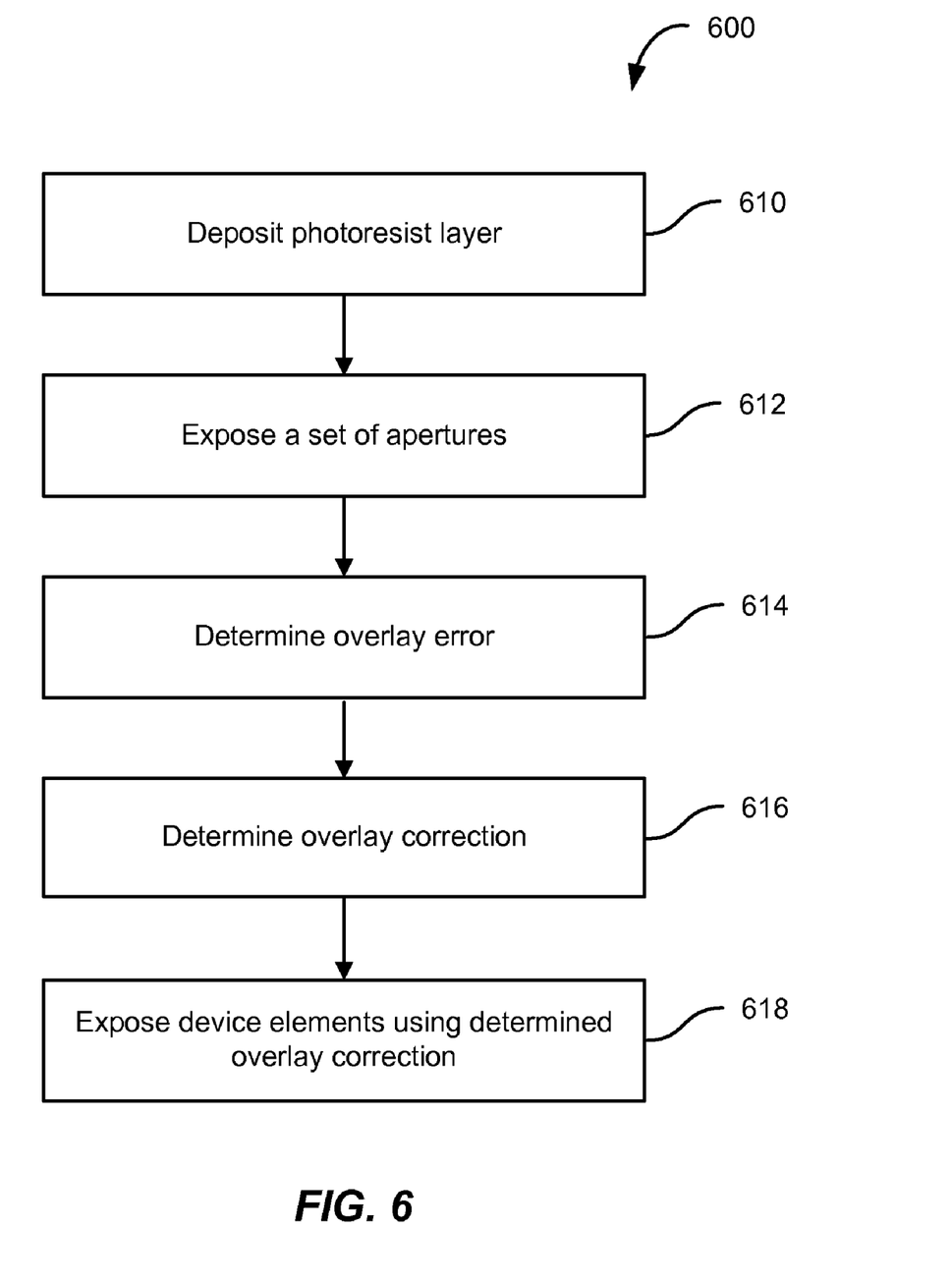
FIG. 6 is a simplified flowchart of a method of performing overlay error correction according to another embodiment of the present invention.

FIG. 6 is a simplified flowchart of a method of performing overlay error correction according to another embodiment of the present invention. The method 600 includes depositing a layer of photoresist on a substrate (610). The properties of the photoresist layer, including thickness, are selected as appropriate to the particular process flow being performed on the substrate. Additional layers associated with the photoresist layer, for example, adhesion promoters such as HMDS, a bottom anti-reflection coating (BARC), a top-anti-reflection coating (TARC), and the like are included in embodiments of the present invention. In the embodiment illustrated in FIG. 6, a set of overlay correction boxes is provided in a previous process step. This set of overlay correction boxes are illustrated as features 210a-210d in FIG. 2.

A set of apertures are exposed (610) in relation to the overlay correction boxes 210a-210d. In the embodiment shown in FIG. 2, the set of apertures are illustrated to as boxes 310a-310d, but this is not required by the present invention. Other alignment mark shapes are provided in other embodiments. For instance, as one example, the shape of the overlay correction boxes may not be rectangular, but L-shaped, with one or more corresponding L-shaped apertures suitable for registration to the L-shaped overlay correction boxes. Thus the term overlay correction boxes is not limited to rectangular of "box" shaped features, which are merely utilized as exemplary features herein. One of ordinary skill in the art would recognize many variations, modifications, and alternatives.

The overlay error is determined (614) by measuring the registration of the set of apertures to the overlay correction boxes 210a-210d. Various methods may be utilized to determine the overlay error including optical methods, diffraction-based methods such as scatterometry, and the like. The overlay correction is determined (616) as a function of the overlay error. Utilizing the determined overlay correction, the device features are exposed (618) in a data area of the second mask. Since the overlay error measured using the set of apertures was utilized in performing the second exposure, the device elements or features in the data area are exposed with reduced to minimal overlay error. Thus, embodiments of the present invention provide for increased device yields. Additionally, since the second exposure is performed using the photoresist layer previously deposited (610), no rework is needed in some embodiments of the present invention. Thus, embodiments of the present invention also provide for increased throughput and cost savings.

It should be appreciated that the specific steps illustrated in FIG. 6 provide a particular method of performing overlay error correction according to another embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives.

While the present invention has been described with respect to particular embodiments and specific examples thereof, it should be understood that other embodiments may fall within the spirit and scope of the invention. The scope of the invention should, therefore, be determined with reference to the appended claims along with their full scope of equivalents.

What is claimed is:

1. A method of performing overlay error correction, the method comprising:
   forming a photoresist layer over a substrate;
   exposing a first set of apertures to incident radiation;
   determining an overlay error associated with the first set of apertures;
   determining an overlay correction as a function of the determined overlay error;
   exposing a data area and a second set of apertures based, in part, on the determined overlay correction; and
   verifying the determined overlay correction.

2. The method of claim 1 wherein the substrate comprises CMOS elements.

3. The method of claim 2 wherein the substrate further comprises MEMS elements electrically coupled to the CMOS elements.

4. The method of claim 3 wherein the CMOS elements comprise electrodes and the MEMS elements comprise micro-mirrors.

5. The method of claim 1 wherein the substrate comprises a set of overlay correction elements prior to forming a photoresist layer over the substrate.

6. The method of claim 5 wherein determining an overlay error is performed based on a registration of the first set of apertures to the set of overlay correction elements.

7. The method of claim 1 wherein the substrate comprises a second set of overlay correction elements prior to forming a photoresist layer over the substrate.

8. The method of claim 7 wherein verifying the determined overlay correction is performed based on a registration of the second set of apertures to the second set of overlay correction elements.

9. A method of performing overlay error correction, the method comprising:
   forming a photoresist layer over a substrate;
   exposing a set of apertures to incident radiation;
   determining an overlay error associated with the set of apertures;
   determining an overlay correction as a function of the determined overlay error; and
   exposing a data area of the substrate, based, in part, on the determined overlay correction.

10. The method of claim 9 wherein the substrate comprises CMOS elements.

11. The method of claim 10 wherein the substrate further comprises MEMS elements electrically coupled to the CMOS elements.

12. The method of claim 11 wherein the CMOS elements comprise electrodes and the MEMS elements comprise micro-mirrors.

13. The method of claim 9 wherein the substrate comprises a set of overlay correction elements prior to forming a photoresist layer over the substrate.

14. The method of claim 13 wherein determining an overlay error is performed based on a registration of the first set of apertures to the set of overlay correction elements.

15. The method of claim 9 wherein the substrate comprises a second set of overlay correction elements prior to forming a photoresist layer over the substrate.

16. The method of claim 15 further comprising verifying the determined overlay correction based on a registration of the second set of apertures to the second set of overlay correction elements.

* * * * *